United States Patent
Singh et al.

(10) Patent No.: US 7,560,953 B1
(45) Date of Patent: Jul. 14, 2009

(54) POWER MANAGEMENT SYSTEMS AND METHODS FOR PROGRAMMABLE LOGIC DEVICES

(75) Inventors: Satwant Singh, Fremont, CA (US); Fabiano Fontana, San Jose, CA (US); David Chang, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 12/107,883

(22) Filed: Apr. 23, 2008

(51) Int. Cl.
*H03K 19/173* (2006.01)
(52) U.S. Cl. .......................................... 326/38; 326/82
(58) Field of Classification Search .............. 326/37–41
See application file for complete search history.

(56) References Cited

U.S. PATENT DOCUMENTS 5,739,701 A    4/1998  Oshima
6,058,063 A    5/2000  Jang
6,674,303 B1 * 1/2004  Morse et al. ................... 326/41
6,867,615 B1 * 3/2005  Plants et al. ................... 326/40
7,274,606 B2  9/2007  Stave

OTHER PUBLICATIONS

Lattice Semiconductor Corporation, Introduction to ispMACH 4000V/B/C/Z Families, Jan. 2004, 19 pages.
XILINX, Using DataGATE in CoolRunner-II CPLDs, XAPP395 (V.1.2), Sep. 22, 2003, 9 pages.

* cited by examiner

*Primary Examiner*—Don P Le
(74) *Attorney, Agent, or Firm*—Haynes and Boone, LLP

(57) ABSTRACT

A programmable logic device, in accordance with an embodiment, includes a first terminal; an input buffer having a buffer input terminal and a buffer output terminal; and a multiplexer coupled to the first terminal and to the input buffer, wherein the multiplexer is adapted to selectively couple either the first terminal to the buffer input terminal or couple the buffer output terminal to the buffer input terminal.

20 Claims, 4 Drawing Sheets

POWER MANAGEMENT SYSTEMS AND METHODS FOR PROGRAMMABLE LOGIC DEVICES

TECHNICAL FIELD

The present invention relates generally to electrical circuits and, more particularly, to power management techniques for programmable logic devices.

BACKGROUND

A programmable logic device (PLD, e.g., a field programmable gate array (FPGA) or a complex programmable logic device (CPLD)) may be used in a variety of applications and may provide certain advantages over other types of devices. For example, a PLD offers the advantage of being reprogrammable in the field (e.g., a field update, with the PLD in its operational environment).

A conventional PLD may be designed for low power applications (e.g., referred to as low power, ultra low power, or zero power PLD) and may provide, for example, a very low standby current (SICC) and consume very little power when PLD signals are not active. For example, PLD signals may include signals to input buffers (e.g., via an input pin) and signals within the PLD (e.g., signals being driven by the input buffers).

A common technique to reduce PLD power usage is to deactivate certain signals, as needed, which are not required to be active. A conventional PLD approach may statically and/or dynamically allow a user of the PLD to deactivate certain internal PLD signals. However, a drawback with this conventional approach is that it only addresses internal PLD signals and does not address power usage of the input buffers or associated circuitry.

As a result, there is a need for improved power management techniques for PLDs.

SUMMARY

In accordance with one embodiment of the present invention, a programmable logic device includes a plurality of logic blocks; a plurality of input terminals; a routing resource adapted to couple the logic blocks to the input terminals; an input buffer disposed between a first input terminal and the routing resource, the input buffer having a buffer input terminal and a buffer output terminal; and a multiplexer disposed between the first input terminal and the input buffer, wherein the multiplexer is adapted to couple, under control of a multiplexer control signal, the first input terminal to the buffer input terminal or to couple the buffer output terminal to the buffer input terminal.

In accordance with another embodiment of the present invention, a programmable logic device includes a first terminal of the programmable logic device; an input buffer having a buffer input terminal and a buffer output terminal; and a multiplexer coupled to the first terminal and to the input buffer, wherein the multiplexer is adapted to selectively couple either the first terminal to the buffer input terminal or couple the buffer output terminal to the buffer input terminal.

In accordance with another embodiment of the present invention, a computer-readable medium on which is stored one or more computer programs for performing a method that includes generating at least a first configuration data bit for setting a corresponding fuse to provide a fuse signal within a programmable logic device; generating at least a second configuration data bit for configuring first logic to generate an input enable signal within the programmable logic device; and generating at least a third configuration data bit for configuring second logic within the programmable logic device such that the second logic receives the fuse signal and the input enable signal and provides a multiplexer control signal, based on the fuse signal and the input enable signal, to a multiplexer disposed between an input/output (I/O) terminal and an input buffer within the programmable logic device, and wherein the multiplexer control signal controls the multiplexer to couple the I/O terminal to an input terminal of the input buffer or to isolate the input buffer from the I/O terminal by coupling an output terminal of the input buffer to an input terminal of the input buffer.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
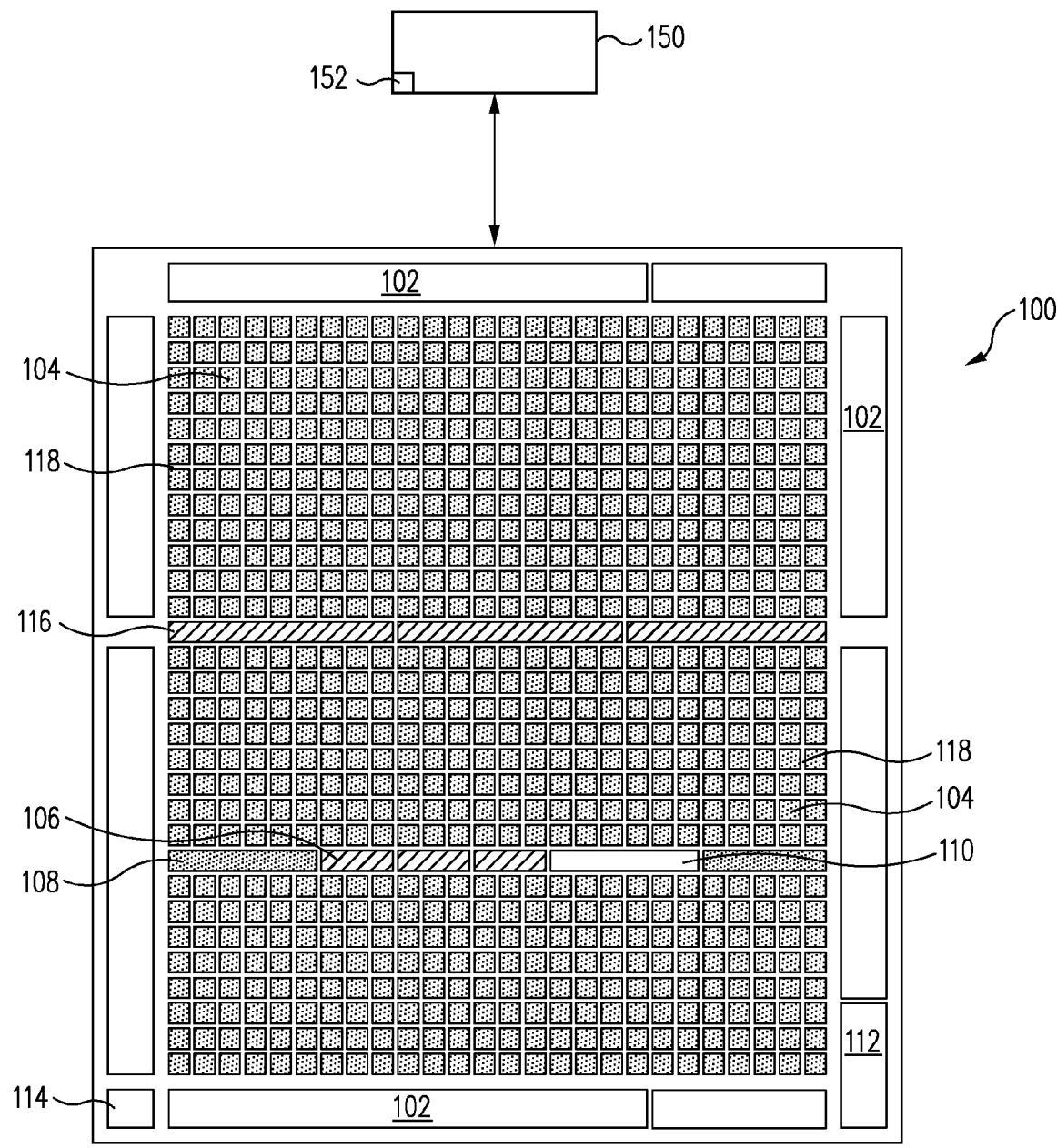
FIG. 1 shows a block diagram illustrating an example of a programmable logic device in accordance with an embodiment of the present invention.

FIG. 1 shows a block diagram illustrating a programmable logic device (PLD) 100 in accordance with an embodiment of the present invention. PLD 100 (e.g., a field programmable gate array (FPGA), a complex programmable logic device (CPLD), a field programmable system on a chip (FPSC), or other type of programmable device) may generally include input/output (I/O) blocks 102 and logic blocks 104 (e.g., also referred to as programmable logic blocks (PLBs), programmable functional units (PFUs), generic logic blocks (GLBs), or programmable logic cells (PLCs)). I/O blocks 102 provide I/O functionality (e.g., supports one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support, such as dual boot support, and/or error detection), a configuration port 112, configuration memory 114, special function blocks 116 (e.g., DSP blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

In general, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively).

Furthermore, it should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements of PLD 100 may not be required or may be of a simplified version or related type of circuit based upon the desired application or design specification (e.g., for the type of programmable device selected), as would be understood by one skilled in the art.

Figure 2:
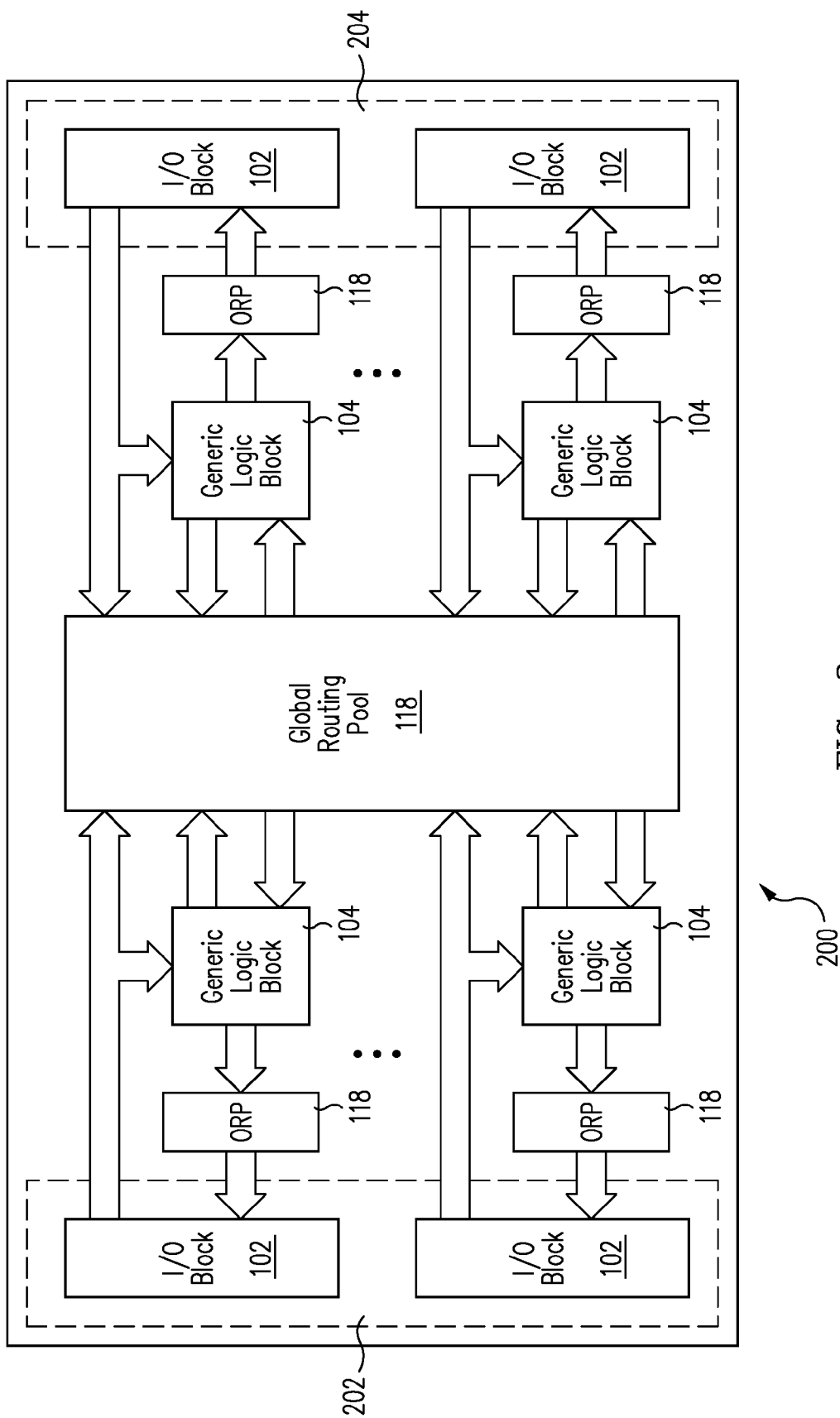
FIG. 2 shows a block diagram illustrating an example of a programmable logic device in accordance with an embodiment of the present invention.

PLD 100, as noted herein, may represent any type of programmable device. For example, PLD 100 may represent a CPLD and be implemented as a PLD 200 as shown in FIG. 2 in accordance with an embodiment of the present invention. Thus, as shown in FIG. 2, PLD 200 may include I/O blocks 102, logic blocks 104, and routing resources 118 (e.g., a global routing pool (GRP) and/or output routing pools (ORPs)). As an example, one or more I/O blocks 102 may be organized into I/O banks, such as shown for an I/O bank 202 (e.g., I/O bank 0) and an I/O bank 204 (e.g., I/O bank 1).

Figure 3:
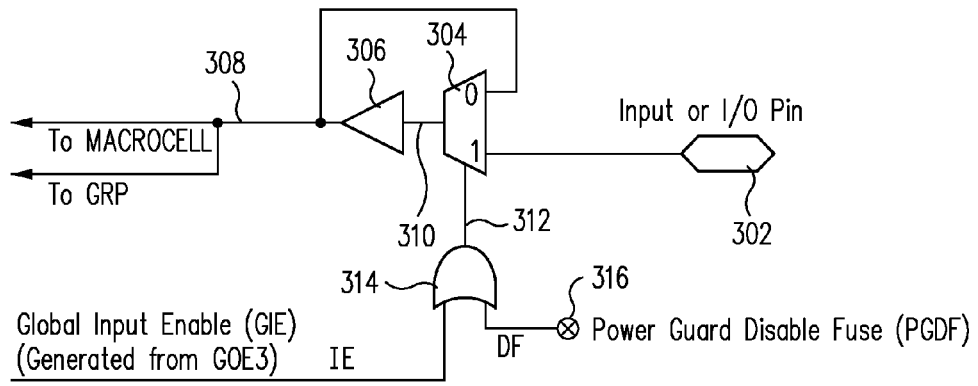
FIG. 3 shows a block diagram illustrating an example of a circuit implementation for a portion of the programmable logic device of FIG. 1 or FIG. 2 in accordance with an embodiment of the present invention.

In accordance with one or more embodiments of the present invention, one or more I/O blocks 102 (within PLD 100 and/or PLD 200) may be implemented with techniques disclosed herein to reduce power consumption. For example, FIG. 3 shows a block diagram illustrating a circuit 300, which may be implemented within a portion of one or more I/O blocks 102 in accordance with an embodiment of the present invention. Circuit 300 includes a multiplexer 304 and an input buffer 306.

Multiplexer 304 (e.g., a two-to-one multiplexer) may be disposed between an input terminal 302 (e.g., input or I/O pin to PLD 100 or 200) and input buffer 306. Consequently, if multiplexer 304 is controlled (e.g., by a user of the PLD) to select path 1, then input terminal 302 is coupled to input buffer 306 (e.g., input buffer 306 is coupled to input terminal 302 in a conventional fashion). However, if multiplexer 304 is controlled to select path 0, then an output terminal 308 of input buffer 306 is coupled to its input terminal 310 (via the path 0 of multiplexer 304 as shown in FIG. 3), which isolates input terminal 302 from input buffer 306.

The implementation of multiplexer 304 with input buffer 306, in accordance with an embodiment, may be referred to herein as a power guard (PG) technique and may allow a user to selectively isolate input buffer 306 within I/O block 102 from input terminal 302. Thus, any active signal received by input terminal 302 (e.g., toggling of the input terminal 302) may be blocked from being received by input buffer 304 and, therefore, there is no resulting power consumption (e.g., no dynamic ICC or dynamic power consumption) by input buffer 304 due to this active signal. Furthermore, with input buffer 304 isolated from input terminal 302, other internal signals that may be provided, for example, by input buffer 304 to routing resources 118 (e.g., to GRP) or to logic blocks 104 (e.g., to macrocells within logic blocks 104) may also be isolated from activity on input terminal 302, which may provide further dynamic power savings. Thus, input buffer 304 may be isolated along with internal signals that may be driven by input buffer 304 or internal signals and circuit elements otherwise associated with (e.g., downstream of) input buffer 304 (e.g., downstream buffers and associated signals are likewise isolated).

Multiplexer 304 may be controlled in a conventional fashion by applying a control signal on a control terminal 312 of multiplexer 304. The control signal on control terminal 312 may be provided, in accordance with an embodiment, via logic 314 (e.g., an OR gate) that may receive one or more signals. For example, an input enable (IE) signal (e.g., a global input enable (GIE) signal) may be provided via logic 314 to dynamically (e.g., after configuration and during a user mode of operation of the PLD) control multiplexer 304 based on user control or by logic during user mode of operation. As discussed further herein, the IE signal may be generated based on a global output enable (GOE) signal in accordance with an embodiment. As another example, a disable fuse (DF) signal (e.g., power guard disable fuse or PGDF) may be provided from a fuse 316 (e.g., any type of volatile or non-volatile memory cell, such as a static random access memory cell or a flash memory cell, respectively) via logic 314 to statically (e.g., set during configuration of the PLD) control multiplexer 304.

Figure 4:
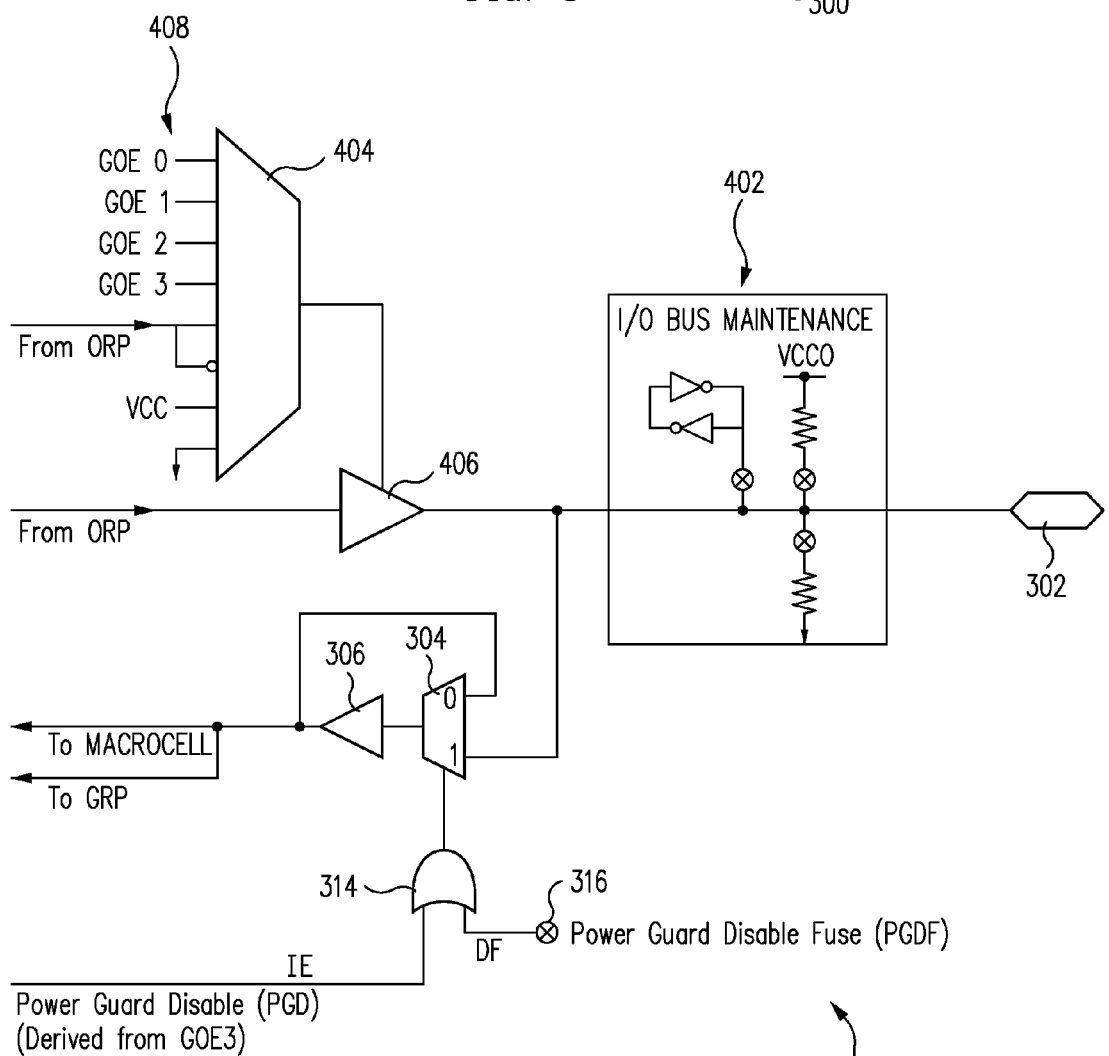
FIG. 4 shows a block diagram illustrating an example of a circuit implementation for a portion of the programmable logic device of FIG. 1 or FIG. 2 in accordance with an embodiment of the present invention.

As another example, FIG. 4 shows a block diagram illustrating a circuit 400, which may be implemented within a portion of one or more I/O blocks 102 (e.g., of FIG. 1 or FIG. 2) in accordance with an embodiment of the present invention. Circuit 400 may represent an I/O cell within I/O block 102, with circuit 400 including various techniques discussed in reference to FIG. 3.

Circuit 400 includes input terminal 302, multiplexer 304, and input buffer 306 and further includes a multiplexer 404 and an output buffer 406. The discussion for multiplexer 304 and input buffer 306, as set forth in reference to FIG. 3, will not be repeated. However, it is noted that logic 314 for this example is represented by an AND gate, with logic values of the input enable (IE) signal and the disable fuse (DF) signal being applied appropriately, as desired, to control multiplexer 304, as would be understood by one skilled in the art.

Multiplexer 404 may represent an output multiplexer that receives various output enable signals 408 that may be selected to control output buffer 406. A programmable I/O bus maintenance circuit 402 may also be provided, as would be understood by one skilled in the art.

Figure 5:
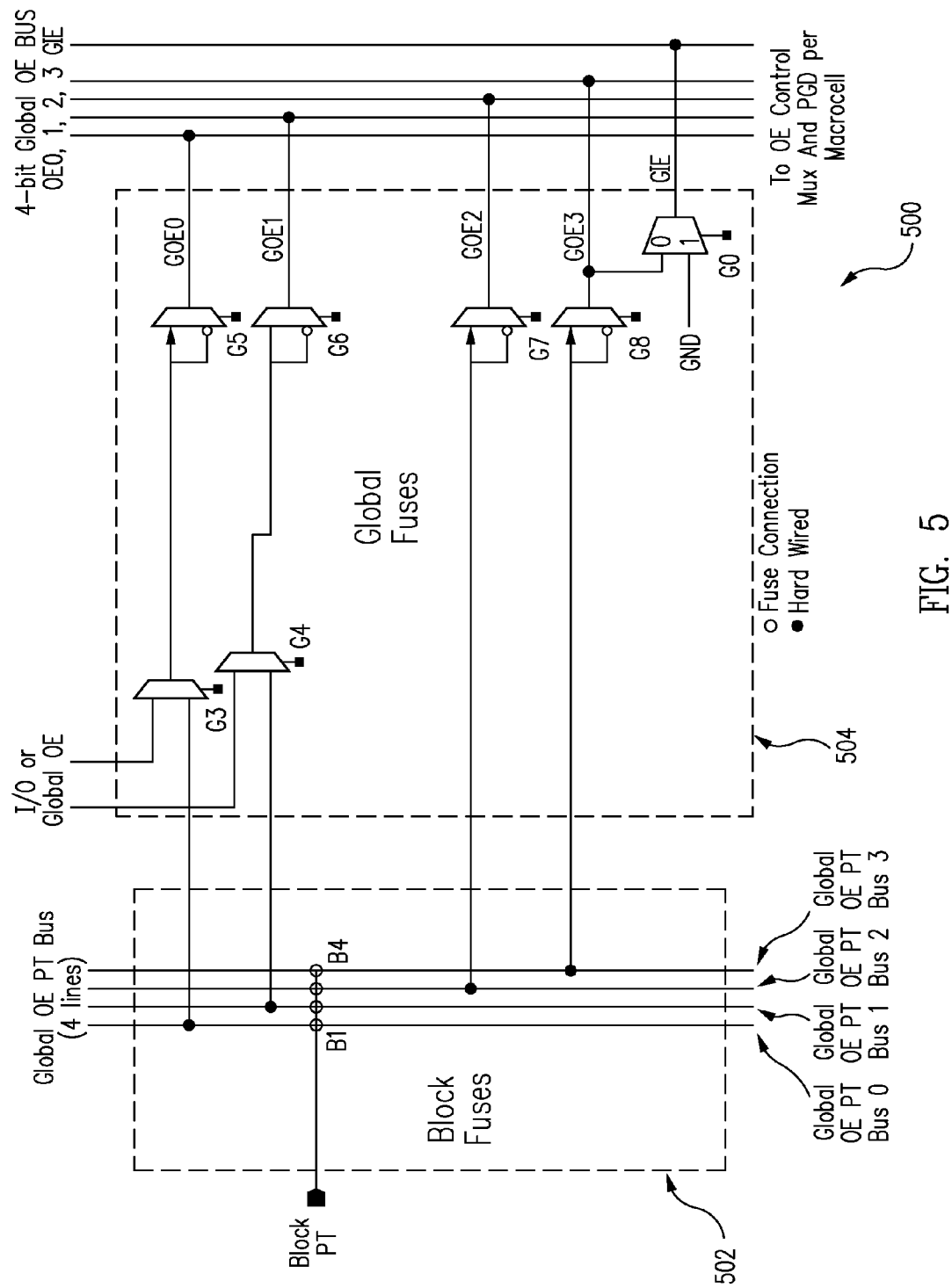
FIG. 5 shows a block diagram illustrating an implementation example for signal generation within the programmable logic device of FIG. 1 or FIG. 2 in accordance with an embodiment of the present invention.

FIG. 5 shows a block diagram illustrating a circuit 500, which represents an implementation example for signal generation for PLD 100 (FIG. 1) or PLD 200 (FIG. 2) in accordance with an embodiment of the present invention. Circuit 500, for example, illustrates a four-bit wide global output enable (GOE) bus 502 (e.g., derived from a four-bit internal global OE product term (PT) bus and two dual purpose input/output (I/O) or GOE pins), which in conjunction with a global fuse circuit block 504 (e.g., including various multiplexers and fuses) may provide various GOE signals (e.g., GOE1 through GOE3) and the GIE signal (e.g., the IE signal of FIG. 3 or FIG. 4), as would be understood by one skilled in the art.

Systems and methods are disclosed herein to provide improved power management techniques in accordance with one or more embodiments of the present invention. For example, in accordance with an embodiment of the present invention, techniques are disclosed to reduce PLD standby current within a PLD. As a specific example for an embodiment, an enable signal may be used to optionally isolate inputs (e.g., input buffers and/or input terminal signals, such as for clock, data, or other types of buffers and input terminals), such that if inputs are toggled there would not be a resulting internal dynamic power consumption (e.g., this technique may be referred to herein as a power guard (PG) for a PLD (e.g., a CPLD)). The enable signal, for example, may be provided by a global control signal (e.g., internally generated dynamically or statically) or by a static local (or global) control signal (e.g., via an SRAM cell (fuse)), which enables or disables the PG technique for selected inputs (e.g., mutually exclusive with the GOE3 signal for an example disclosed herein).

In general for example, some conventional approaches fail to isolate PLD signals from toggling pins on the system board and thus, do not provide adequate dynamic power savings as discussed herein. In contrast for some embodiments, the PG technique may allow a user to reduce the dynamic power, even if I/Os that may be tied to traces on the system board are still toggling (e.g., resulting in dynamic ICC within a conventional PLD).

The techniques (e.g., PG techniques) may be implemented to reduce power usage by selectively and dynamically (i.e., after configuration and during user operation) disabling various signals (e.g., signals associated with input buffers and signals being driven by input buffers or associated with signals being driven by input buffers). As a specific example for one embodiment, Table 1 shown below illustrates an example for using techniques disclosed herein for various situations to reduce power consumption within a PLD implemented with techniques (e.g., PG techniques) disclosed herein (e.g., in reference to FIGS. 4 and 5).

In general in accordance with an embodiment, the GIE signal may represent a global signal that dynamically enables or disables the input buffer participation in the PG feature for the I/O or input terminals that have the PG feature enabled by the PGDF fuse. The GIE signal may be generated, as a specific example, from the GOE3 signal. For example for an embodiment, a PLD with the PG feature may be compatible with prior designs by simply using only the GOE3 signal and not using the GIE signal (e.g., unused, tied to logical low (0)). As another example for an embodiment, the PG feature may be used, while the GOE3 signal is not used (e.g., for enabling/disabling output buffers), and thus the GIE signal may be used to enable/disable participation of selected input buffers for the PG feature. As another example for an embodiment, the PG feature and the GOE3 signal may be used, with the GOE3 signal controlling certain selected output buffers (e.g., enabled when the GOE3 signal is at a logical high (=1) and disabled otherwise) and the GIE signal controlling certain selected input buffers (e.g., inputs enabled when the GIE signal is at a logical high (=1) and disabled to save dynamic power when the GIE signal is at a logical low

TABLE 1

| Situation | GIE Signal | PGDF Fuse | Comments |
|---|---|---|---|
| User Does Not Use PG Feature | Not Asserted (e.g., tied low (= 0)) | Provides Logical Low (= 0) for unused input terminals; Provides Logical High (= 1) for used input terminals or I/O | Use PG feature to reduce dynamic ICC for output-only I/Os and/or unused input terminals |
| User uses PG Feature | Tied to a live signal via GOE3 PT; User's logic may drive GOE3 = GIE = 0 to disable selected output and input buffers to reduce power consumption | Provides Logical High for input terminals or I/Os that do not participate in PG feature (PG disabled); Provides Logical Low (= 0) for input terminals or I/Os that participate in PG feature via the GIE signal; Provides Logical Low (= 0) for unused input terminals or I/Os | PG feature selected to reduce power consumption on unused input terminals or I/Os if the GIE signal = 0 |
| Blank Device - Bulk Erase | Not Asserted (e.g., tied low (= 0)) | Provides Logical High (= 1) | Provides conventional PLD functionality |

In accordance with an embodiment and referring generally to FIGS. 1-5, a device 150 (e.g., a computer as shown in FIG. 1) may be used to run PLD design tool software stored in memory 152 (FIG. 1) to perform the PLD design process and to generate configuration data and program the PLD (e.g., PLD 100 or PLD 200) according to the techniques disclosed herein, as would be understood by one skilled in the art. Memory 152 may be a permanent memory (e.g., a fixed hard drive) within device 150 or may represent portable memory (e.g., portable hard drive, compact disk, flash memory, or other type of memory) capable of storing the PLD design tool software and couplable to device 150 to allow access to the information within memory 152. As a specific example, the PLD design tool software would incorporate the techniques disclosed herein, as would be understood by one skilled in the art, to permit a user to set the PGDF fuse, generate the desired internal signals (e.g., the GIE signal), and configure the PLD (e.g., including I/O blocks 102, logic blocks 104, and routing resources 118) to perform the functions desired by a user.

Embodiments described above illustrate but do not limit the invention. For example, the input buffer and multiplexer in other embodiments need not be implemented within an I/O block. It should also be understood that numerous modifications and variations are possible in accordance with the principles of the present invention. Accordingly, the scope of the invention is defined only by the following claims.

What is claimed is:

1. A programmable logic device comprising:
   a plurality of logic blocks;
   a plurality of input terminals;
   a routing resource adapted to couple the logic blocks to the input terminals;
   an input buffer disposed between a first input terminal and the routing resource, the input buffer having a buffer input terminal and a buffer output terminal; and a multiplexer disposed between the first input terminal and the input buffer, wherein the multiplexer is adapted to couple, under control of a multiplexer control signal, the first input terminal to the buffer input terminal or to couple the buffer output terminal to the buffer input terminal.

2. The programmable logic device of claim 1, further comprising a plurality of input/output (I/O) blocks disposed between the input terminals and the routing resource, wherein at least one of the I/O blocks includes the input buffer and the multiplexer.

3. The programmable logic device of claim 1, wherein the input buffer is isolated from the first input terminal if the multiplexer is controlled to couple the buffer output terminal to the buffer input terminal.

4. The programmable logic device of claim 1, further comprising a logic circuit adapted to provide the multiplexer control signal.

5. The programmable logic device of claim 1, further comprising a logic circuit adapted to provide the multiplexer control signal, wherein the logic circuit is adapted to receive an input enable signal to provide dynamic control instructions for the multiplexer and to receive a fuse signal to provide static control instructions for the multiplexer.

6. The programmable logic device of claim 1, wherein the routing resource comprises a global routing pool and a plurality of output routing pools.

7. The programmable logic device of claim 2, further comprising:
a configuration memory adapted to store configuration data for configuration of the logic blocks, the I/O blocks, and the routing resource of the programmable logic device;
a memory block; and
a configuration port adapted to receive the configuration data for the programmable logic device from an external device.

8. The programmable logic device of claim 2, wherein the plurality of input terminals correspond to the plurality of I/O blocks, and wherein each of the I/O blocks comprises at least one of the input buffers and at least one of the multiplexers.

9. The programmable logic device of claim 1, wherein the programmable logic device comprises a complex programmable logic device and the logic blocks comprise array-based logic.

10. A programmable logic device comprising:
a first terminal of the programmable logic device;
an input buffer having a buffer input terminal and a buffer output terminal; and
a multiplexer coupled to the first terminal and to the input buffer, wherein the multiplexer is adapted to selectively couple either the first terminal to the buffer input terminal or couple the buffer output terminal to the buffer input terminal.

11. The programmable logic device of claim 10, wherein the multiplexer is adapted to selectively couple under control of a multiplexer control signal, with the programmable logic device further comprising a logic circuit adapted to provide the multiplexer control signal to the multiplexer, and wherein the logic circuit receives an input enable signal to provide dynamic control instructions for the multiplexer and a fuse signal to provide static control instructions for the multiplexer.

12. The programmable logic device of claim 11, wherein the fuse signal is provided by a configuration memory cell of the programmable logic device.

13. The programmable logic device of claim 10, wherein the input buffer and the multiplexer comprise an input/output (I/O) block, with the programmable logic device further comprising:
a plurality of logic blocks;
a plurality of I/O blocks;
a routing resource adapted to couple the logic blocks to the I/O blocks;
configuration memory adapted to store configuration data for configuration of the logic blocks, the I/O blocks, and the routing resource of the programmable logic device;
a memory block; and
a configuration port adapted to receive the configuration data for the programmable logic device from an external device.

14. The programmable logic device of claim 13, wherein the programmable logic device comprises a complex programmable logic device and the logic blocks comprise array-based logic.

15. The programmable logic device of claim 10, wherein the input buffer is isolated from the first terminal if the multiplexer is controlled to couple the buffer output terminal to the buffer input terminal.

16. The programmable logic device of claim 10, wherein the first terminal comprises an I/O pin of the programmable logic device, with the programmable logic device further comprising:
an output buffer coupled to the first terminal; and
an output multiplexer adapted to receive a plurality of output buffer control signals and selectively provide one of the output buffer control signals to the output buffer to control the output buffer providing an output signal from the programmable logic device via the first terminal.

17. A computer-readable medium on which is stored one or more computer programs for performing a method comprising:
generating at least a first configuration data bit for setting a corresponding fuse to provide a fuse signal within a programmable logic device;
generating at least a second configuration data bit for configuring first logic to generate an input enable signal within the programmable logic device; and
generating at least a third configuration data bit for configuring second logic within the programmable logic device such that the second logic receives the fuse signal and the input enable signal and provides a multiplexer control signal, based on the fuse signal and the input enable signal, to a multiplexer disposed between an input/output (I/O) terminal and an input buffer within the programmable logic device, and wherein the multiplexer control signal controls the multiplexer to couple the I/O terminal to an input terminal of the input buffer or to isolate the input buffer from the I/O terminal by coupling an output terminal of the input buffer to the input terminal of the input buffer.

18. The method of claim 17, further comprising generating at least a fourth configuration data bit for configuring the multiplexer and the input buffer within the programmable logic device.

19. The method of claim 17, further comprising programming the programmable logic device with at least the first, second, and third configuration bit.

20. The method of claim 17, further comprising generating at least a fourth configuration data bit for configuring a plurality of logic blocks and routing resources within the programmable logic device, and wherein the programmable logic device comprises a complex programmable logic device.

* * * * *